United States Patent [19]
Ginetti

[11] Patent Number: 5,831,566
[45] Date of Patent: Nov. 3, 1998

[54] LOW VOLTAGE DIGITAL-TO-ANALOG CONVERTER

[75] Inventor: Bernard Ginetti, Antibes, France

[73] Assignee: VLSI Technology, Inc., San Jose, Calif.

[21] Appl. No.: 643,894

[22] Filed: May 7, 1996

[51] Int. Cl.$^6$ ...................................................... H03M 1/66
[52] U.S. Cl. ............................................................. 341/144
[58] Field of Search ..................................... 341/144, 154, 341/146, 147, 148, 149, 150, 151, 152, 153

[56] References Cited

U.S. PATENT DOCUMENTS

| | | | |
|---|---|---|---|
| 4,462,021 | 7/1984 | Watanabe et al. | 341/144 |
| 5,126,740 | 6/1992 | Kawada | 341/144 |

*Primary Examiner*—Brian K. Young
*Attorney, Agent, or Firm*—Hickman Beyer & Weaver

[57] ABSTRACT

A low voltage digital-to-analog converter (DAC) uses a resistor string to divide a supply voltage. The voltage output for the DAC is fixed at an intermediary node in the resistor string, and NMOS and PMOS transistors are used to switch in $V_{SS}$ and $V_{DD}$ respectively to nodes in the resistor string such that the NMOS and PMOS transistors are operated where they are most conductive. A decoder is used to decode the digital input to control the switches. One switch from each set of NMOS and PMOS transistors is activated for a given input, or thermometric decoding of the input is used to activate more than one switch from each set to preserve monotonicity. In an alternative embodiment, when matching of the resistors can be assumed, a two-step decoding process is used. An LSB decoder decodes the least significant bits of the digital input and controls how $V_{DD}$ is applied to a bank of LSB resistors through PMOS transistors, and how $V_{SS}$ is applied to a second bank of LSB resistors through NMOS transistors. The output from each of these LSB banks lead into to a first MSB bank of resistors and a second bank of MSB resistors, respectively. An MSB decoder decodes the most significant bits of the digital input and controls how the output from the first LSB bank is applied to the first bank of MSB resistors through PMOS transistors, and how the output from the second LSB bank is applied to the second bank of MSB resistors through NMOS transistors. Each MSB resistor is greater than seven LSB resistors in series, and the maximum impedance difference between switches is smaller than an LSB resistor in order to preserve monotonicity of the DAC.

22 Claims, 4 Drawing Sheets

| DAC Input Code | Thermometric Code | Activated (Closed) Switches |
|---|---|---|
| 0 | 0 0 0 | MN3, MN2, MN1, MN0 and MP0 |
| 1 | 0 0 1 | MN3, MN2, MN1, MP1 and MP0 |
| 2 | 0 1 1 | MN3, MN2, MP2, MP1 and MP0 |
| 3 | 1 1 1 | MN3, MP3, MP2, MP1 and MP0 |

| DAC INPUT CODE MSB LSB | MSB DECODER OUTPUT | LSB DECODER OUTPUT | SWITCHES CLOSED |
|---|---|---|---|
| 0    000 000 | 00000001 | 00000001 | MPL0, MPM0, MNM0,MNL0 |
| 1    000 001 | 00000001 | 00000010 | MPL1, MPM0, MNM0,MNL1 |
| 2    000 010 | 00000001 | 00000100 | MPL2, MPM0, MNM0,MNL2 |
| 3    000 011 | 00000001 | 00001000 | MPL3, MPM0, MNM0,MNL3 |
| ⋮ | ⋮ | ⋮ | ⋮ |
| 7    000 111 | 00000001 | 10000000 | MPL7, MPM0, MNM0,MNL7 |
| 8    001 000 | 00000010 | 00000001 | MPL0, MPM1, MNM1,MNL0 |
| 9    001 001 | 00000010 | 00000010 | MPL1, MPM1, MNM1,MNL1 |
| ⋮ | ⋮ | ⋮ | ⋮ |
| 62   111 110 | 10000000 | 01000000 | MPL6, MPM7, MNM7,MNL6 |
| 63   111 111 | 10000000 | 10000000 | MPL7, MPM7, MNM7,MNL7 |

FIG. 3A

LOW VOLTAGE DIGITAL-TO-ANALOG CONVERTER

TECHNICAL FIELD

The present invention relates generally to digital-to-analog converters and, more specifically, to a monotonic low voltage digital-to-analog converter.

BACKGROUND ART

Digital-to-analog converters are used to convert a digital input signal to an analog output signal. The simplest technique used to build a digital-to-analog converter (DAC) uses a series of resistors (a "resistor string") connected between two supply voltages to serve as a multi-step voltage divider. Such a resistor string DAC is illustrated in FIG. 1a. Switches controlled by the input signal then select a node between two resistors of the resistor string to serve as the analog output signal. Such a resistor string DAC that uses an N-bit digital input requires $2^N$ equal resistors and $2^N$ switches.

More particularly, FIG. 1a illustrates a prior art DAC 10 for a 2-bit digital input. A resistor string has four resistors R0 through R3 connected in series. One end of the string is connected to $V_{SS}$ (ground), and the other end is connected to a supply voltage $V_{DD}$. The resistor string acts as a voltage divider to provide intermediate voltages ranging from $V_{DD}$ to $V_{SS}$ at nodes between the resistors. A 2-bit digital input signal or "code" represents one of four discrete values or "states". This 2-bit input is decoded in a decoder (not shown) that is used to activate one of the switches S0 through S3, thereby selecting a voltage to provide an analog output $V_{OUT}$. These switches S0 through S3 are typically CMOS transistor switches.

The advantages of this design include simplicity, low cost and its inherent monotonicity. A DAC is said to be monotonic if, for increasing input values, the device yields strictly increasing output values. In other words, whatever resistor matching is achieved in the fabrication process for this design and whatever is the targeted resolution, the transfer characteristics of the DAC are ensured to be strictly monotonic. The resolution of a device refers to the number of bits in the input code and determines the smallest change possible in the output analog signal for a DAC. A DAC with more bits in its input code will have a higher resolution. For example, an N-bit code will have $2^N$ quantization levels and $2^N-1$ steps between levels. Even a poor matching of resistors on a given chip, the resolution will not be greatly affected. By "matching" it is meant that the resistors are preferably of the same resistance value but, due to manufacturing variations, may have values that vary as much as 20% or more.

Even with very poor matching of the resistors, the DAC will still achieve a small Differential Linearity Error (DLE). For example, even with a 20% mismatching of resistance values, the DAC still yields a 0.2 least significant bit (LSB) DLE as a worst case. Linearity is a measure of accuracy, and the DLE measures the linearity between code transitions and is a measure of monotonicity. However, a monotonic device does not necessarily have to be linear.

FIG. 1b illustrates in greater detail a DAC 10' of the prior art. Shown in particular are the CMOS switches used to connect nodes of the resistor string to the voltage output. In particular, PMOS switch 22 and NMOS switch 24 connect one end of resistor R0 to $V_{OUT}$. PMOS switch 26 and NMOS switch 28 connect the junction (or "node") of resistors R0 and R1 to $V_{OUT}$. Likewise, switches 30 and 32 connect the node between resistors R1 and R2 to $V_{OUT}$ and switches 34 and 36 connect the node between resistors R2 and R3 to $V_{OUT}$.

It is difficult for such a design to tolerate a low supply voltage ($V_{DD}$) using digital CMOS technology. When $V_{DD}$ is reduced, a "gap" appears in $V_{OUT}$ around one-half of $V_{DD}$ where none of the parallel NMOS and PMOS transistors are conducting. The higher the threshold voltage for the transistors, the higher the minimal operating supply voltage that is needed for a resistor string DAC. In addition, any phenomenon such as a decrease in temperature, the bulk effect, etc., that tends to increase the threshold voltage will make this minimal operating voltage even higher. This "gap" may be better explained by using the following example that assumes a simple first order linear approximation model for a MOS device. An NMOS device is switched ON by applying a $V_{DD}$ supply voltage to its gate and it then acts as a conductor. Conductance is maximal for a channel voltage equal to a supply voltage $V_{SS}$, and linearly decreasing to zero when the channel voltage is increasing up to ($V_{DD}-V_{TN}$), where $V_{TN}$ is the threshold voltage of the NMOS device. Similarly, a PMOS device is switched ON by applying a $V_{SS}$ supply voltage to its gate. Conductance is maximal for a channel voltage equal to $V_{DD}$, and linearly decreasing to zero when the channel voltage is decreasing down to $V_{TP}$, where $V_{TP}$ is the threshold voltage of the PMOS device. Thus, for a $V_{DD}$ supply voltage equal to ($V_{TP}+V_{TN}$) a voltage $V_{TP}=(V_{DD}-VT_1)$ exists for which none of the PMOS or NMOS devices will be conducting. For an even lower supply voltage where $V_{DD}<(V_{TP}+V_{TN})$ there will be a voltage range between ($V_{DD}-V_{TN}$) and $V_{TP}$ where the CMOS switch will not be conducting.

A known solution to this low supply voltage problem involves using a charge pump to create a voltage higher than $V_{DD}$ to control the gates of the NMOS transistors. A charge pump, however, requires a clock, and this clock must be running many cycles before the DAC is operated. Also, the clock must be kept running as long as the DAC output is used even when no input code transition occurs to cope with leakage current. Thus, a charge pump start-up delay exists. Such requirements of a charge pump may not fit many applications where the DAC must be available as a fully asynchronous ready-to-operate unit. Furthermore, the charge pump adds complexity and expense to the circuit.

An example of a charge pump 13 in use is shown in FIG. 1b. The charge pump 13 includes a capacitor 44 and switches 40 and 42 that are used to switch in supply voltages to the capacitor. To operate the charge pump, first switch 40 is closed to node 50, and switch 42 is closed to node 54, thus raising the voltage level at node 54 to $V_{DD}$. Next, both switches 40 and 42 are opened. Finally, switch 40 is closed to node 52 that results in node 54 of the capacitor being boosted to two times the supply voltage $V_{DD}$. Thus, the charge pump presents one solution to a low supply voltage, but is not optimal for many applications.

Accordingly, it would be desirable to have a monotonic digital-to-analog converter that is capable of operating at low supply voltages and avoids the need for a charge pump.

SUMMARY OF THE INVENTION

The present invention modifies a resistor string DAC such that NMOS and PMOS transistors are operated where they are most conductive, i.e. NMOS transistors are operated at $V_{SS}$, and the PMOS transistors are operated at $V_{DD}$. This modification avoids the need for a charge pump, allows smaller devices to be used, and further decreases the DAC minimal operating voltage.

One embodiment of the present invention includes a number of resistors coupled in series such that a node is defined between adjacent resistors of the series. Also, a node is also defined at each end of the series of resistors. An output is permanently wired to a fixed node of the resistor string. A number of switches couple a voltage source to a plurality of said nodes. The switches may be turned on and off thus developing a voltage output at the fixed node.

A decoder is used to decode a digital input to control the switches. The switches preferably include a set of NMOS transistor switches that are coupled to a ground voltage, and a set of PMOS transistor switches that are coupled to a higher supply voltage. The NMOS switches are located to one side of the fixed voltage output node, and the PMOS switches on the other side. One switch from each set may be activated for a given input, or to preserve monotonicity, thermometric decoding of the input may be used to activate more than one switch from each set.

In another embodiment of the invention, a two-step decoding process is used when an assumption about the matching of the resistors can be made. For this embodiment, the DAC includes an N-bit input representing a value X, where the N-bit input has M most significant bits and L least significant bits, and where N=M+L. A first least significant bits (LSB) bank of LSB resistors is coupled in series with a first most significant bits (MSB) bank of MSB resistors. The first LSB bank and the first MSB bank are coupled between a first voltage node and a fixed output node. A second LSB bank of LSB resistors is coupled in series with a second MSB bank of MSB resistors. The second LSB bank and the second MSB bank are coupled between a second voltage node and the fixed output node. An MSB decoder is coupled to the N-bit input to decode the most significant M bits of the input; the MSB decoder controls the first MSB bank and the second MSB bank. An LSB decoder is coupled to the N-bit input to decode the least significant L bits of said input. The LSB decoder controls the first LSB bank and the second LSB bank and operates to selectively apply the first voltage to the first LSB bank, and the second voltage to the second LSB bank. Likewise, the MSB decoder operates to selectively apply an output from the first LSB bank to the first MSB bank, and operates to selectively apply an output from the second LSB bank to the second MSB bank.

The first voltage is preferably a supply voltage that is relatively higher than the second voltage, typically ground. This supply voltage is applied to the first LSB bank via PMOS transistors, and the ground voltage is applied to the second LSB bank via NMOS transistors. The output from the first LSB bank is applied to the first MSB bank via PMOS transistors, and the output from the second LSB bank is applied to the second MSB bank via NMOS transistors. The MSB and LSB decoders operate to switch on only one transistor from each set of transistors for a given input. The MSB decoder controls switching to the first and second MSB bank of resistors via PMOS and NMOS transistors, respectively, and the LSB decoder controls switching to the first and second LSB bank of resistors via PMOS and NMOS transistors, respectively. Each MSB resistor may have a value greater than or equal to $2^L-1$ of the LSB resistors.

Thus, a DAC according to the present invention allows the NMOS and PMOS transistors to operate at the voltage where they are most effective and decreases the minimal operating voltage. Also, fewer transistors may be required and no charge pump or clock is needed, thus allowing a more compact and less complex design.

BRIEF DESCRIPTION OF THE DRAWINGS

The invention, together with further advantages thereof, may best be understood by reference to the following description taken in conjunction with the accompanying drawings in which:

FIG. 3a is a table showing the relationship between a digital input code for the DAC of FIG. 3, the corresponding output from the decoders, and the switches to be closed.

DISCLOSURE OF THE INVENTION

Figure 1A:
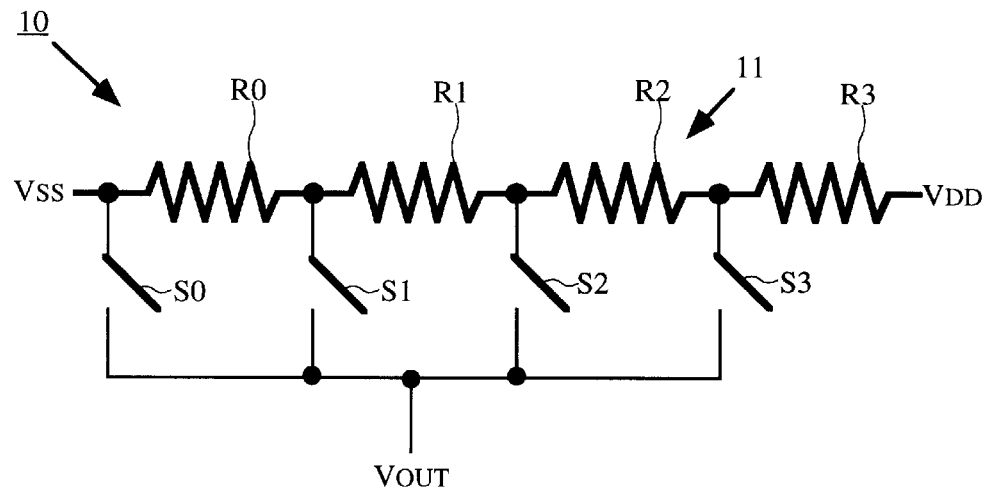
FIG. 1a is a first example of a prior art digital-to-analog converter (DAC).
Figure 1B:
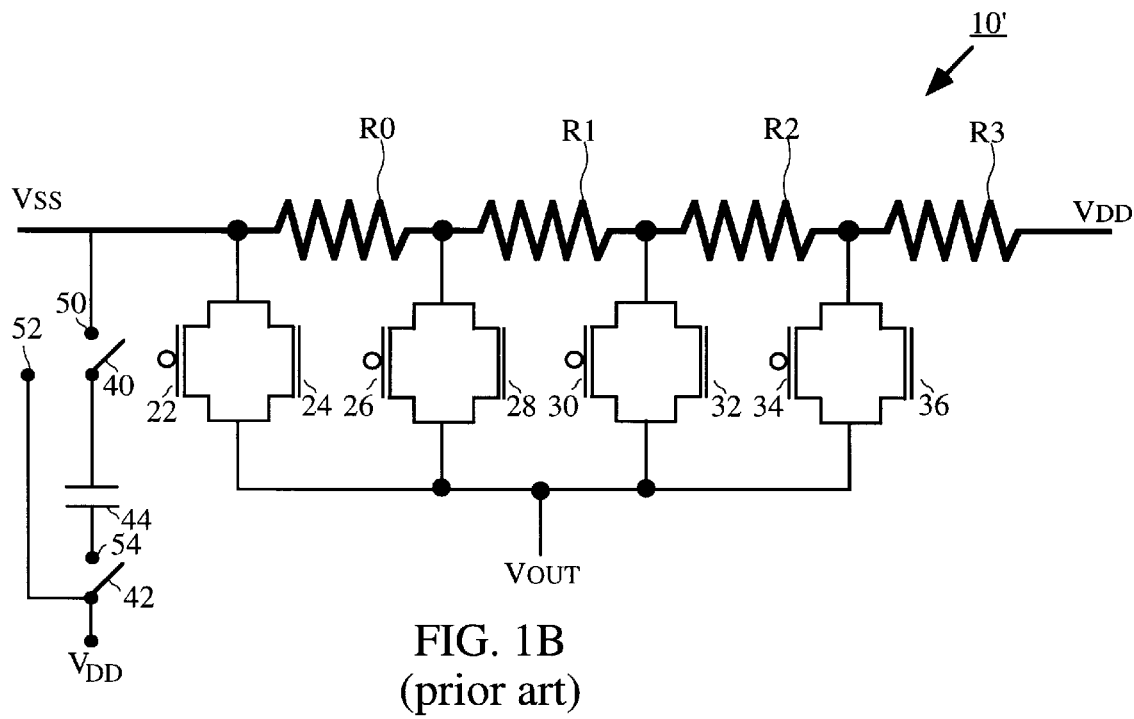
FIG. 1b is a second example of a prior art digital-to-analog converter.
Figures 2, 2A:
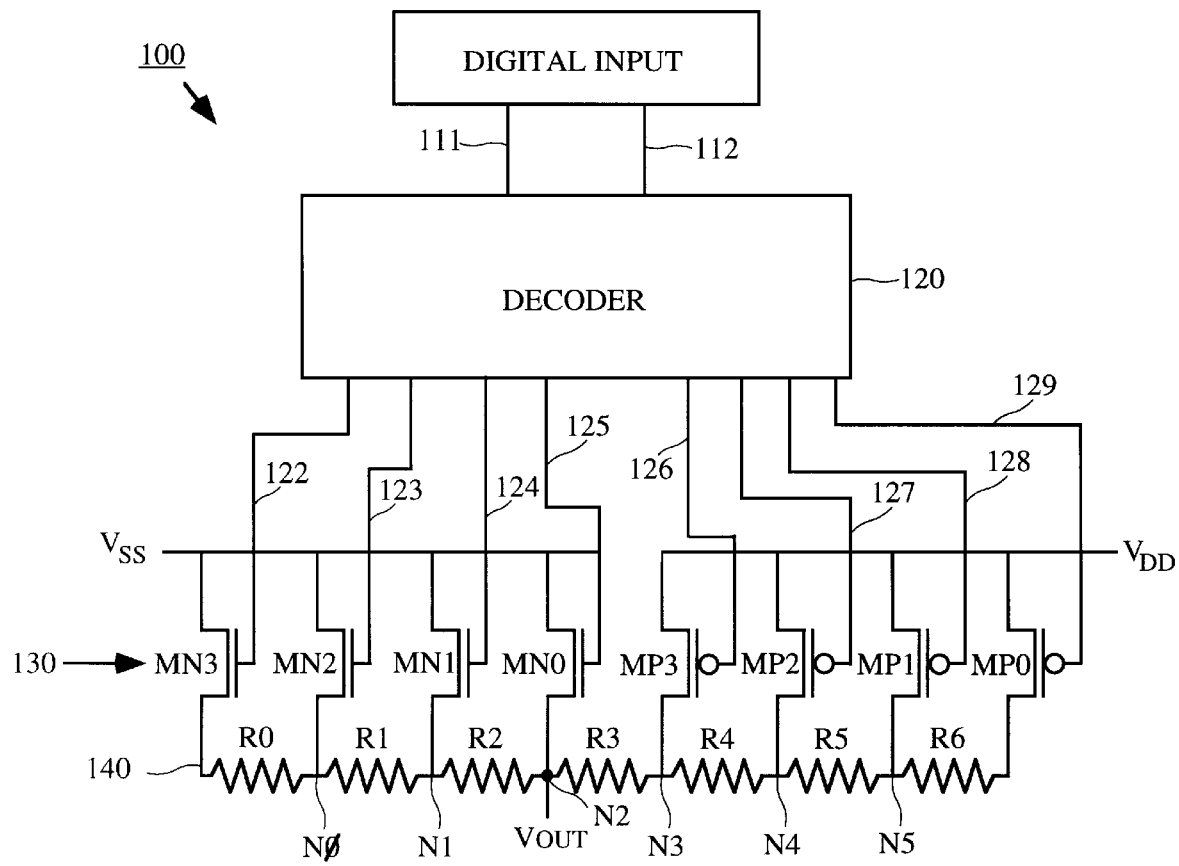
FIG. 2 is a low voltage digital-to-analog converter according to one embodiment of the present invention.
FIG. 2a is a table showing the relationship between a digital input code for the DAC of FIG. 2 and the corresponding closed switches.

FIGS. 1a and 1b were discussed with reference to the prior art. FIG. 2 at 100 shows a low voltage digital-to-analog converter (DAC) according to a preferred embodiment of the present invention. The DAC includes a digital input on lines 111 and 112, a decoder 120, a group of transistor switches 130, a resistor string 140, and a voltage output $V_{OUT}$. The digital input may originate from a variety of sources. By way of example, the digital input may be generated within a computer, within a semiconductor chip, or the like. Although the DAC may be generalized to function with any number of digital input lines, the example of FIG. 2 shows a 2-bit input with input lines 11 and 112.

The decoder 120 receives this digital input and decodes this signal in order to control the opening and closing of the transistor switches 130. The decoder 120 has output lines 122 through 125 that control the NMOS transistor switches MN3 through MN0. Output lines 126 through 129 control the operation of the PMOS transistors, MP3 through MP0. The NMOS transistors operate to apply a voltage $V_{SS}$, to various nodes in the resistor string 140, while the PMOS transistors operate to apply a relatively higher voltage $V_{DD}$ to other nodes on the resistor string. The resistor string 140 has resistors R0 through R6. Located between each pair of resistors is a node labeled N0 through N5. A voltage output $V_{OUT}$ is located at node N2. The present invention therefore fixes $V_{OUT}$ at a particular node, and uses the transistor switches to switch in or out the supply voltages, thus changing the voltage that will be present at the node corresponding to $V_{OUT}$.

For example, according to this embodiment of the present invention, for a given digital input, the decoder is used to turn on exactly one of the NMOS switches and exactly one of the PMOS switches. In this fashion, the resistor string is provided with a supply voltage $V_{DD}$ and a relatively lower voltage $V_{SS}$. For example, if the digital input were "00", then the decoder turns on switch MN0 and switch MP0. If the digital input were "11", then the decoder turns on only the switch MN3 and switch MP3. In this fashion, the voltage at $V_{OUT}$ can be made to vary by switching in $V_{SS}$ and $V_{DD}$ at the appropriate nodes in the resistor string. It is also contemplated that one may dispense with one set of the transistor switches. For example, if R2 were connected directly to $V_{SS}$ instead of through switch MN1, then the NMOS switches may be dispensed with. The decoder would then only switch in $V_{DD}$ through the PMOS transistors to the resistor string in order to vary the voltage at $V_{OUT}$. Likewise, the PMOS switches can be dispensed with in a similar fashion. Although such a design would still ensure monotonicity, the integral linearity would suffer.

According to this embodiment, this standard decoding technique will still yield monotonicity as long as each resistor value is higher than the maximum impedance mismatch between the transistors. If no assumption at all can be made regarding the value of the resistors and the matching of the switches, thermometric decoding of the switches may be used to preserve monotonicity.

Thermometric decoding is used to decode input values to a decoder such that for increasing input values the output sets an increasing number of bits. Of course, the thermometric code may be inverted before it is used to turn on or off an NMOS or a PMOS transistor. In another embodiment of the present invention, thermometric decoding is used to operate the transistor switches in order to preserve the basic advantage of the resistor string DAC, namely its inherent monotonicity. This monotonicity will be preserved no matter what the value may be for the resistors and the matching of the transistors. Such a thermometric decoding technique is shown in FIG. 2a.

FIG. 2a shows a table 150 having a column 152 for a digital input code, a column 153 representing a possible thermometric output code, and a column 154 of the corresponding closed switches. For example, FIG. 2a shows a thermometric code 153 that may be used to control switches MN3 to MN0 and MP3 to MP0. This code will be inverted before it is applied to the switches. As switches MN3 and MP0 are always closed, their inputs will always be a "1" and a "0" respectively. For a DAC input code of value "0" the thermometric code will be "000". Once inverted, this code becomes "111" and is used to turn on all of the switches MN2 to MN0, and to turn off all of the switches MP3 to MP1. For an input code of value "1" the thermometric code will be "001". Once inverted, this code becomes "110" and is used to turn on all of the switches MN2 to MN1, to turn off MN, to turn off all of the switches MP3 to MP2, and to turn on MP1. In this fashion, as the input code increases, successively more of the PMOS transistors are switched in and more of the NMOS transistors are switched out.

In general, a thermometric representation of an N-bit binary code is described as follows. The N-bit binary code represents a value X. The thermometric representation of this number X is a $(2^N-1)$ bit output code. The X lower bits are set to "1" and the $(2^N-1-X)$ upper bits are set to "0".

An example of why thermometric decoding is preferred in order to preserve monotonicity is explained as follows. Assume that a digital input code of "00" is input to the decoder of FIG. 2. Without thermometric decoding, only switch MN0 of switches MN3 through MN0 are closed. But if switch MN0 is a very poor transistor, it may be that its resistance is so high that the voltage at $V_{OUT}$ when MN0 is switched on is higher than the voltage at $V_{OUT}$ when only MN1 is switched on. Thus, the DAC would not be monotonic. In theory, as a digital input increases, resistors R0 to R2 are successively switched in to provide a current path from $V_{SS}$ to $V_{OUT}$ and the resistance should be increasing with each new resistor switched in. But if the resistance of switch MN0 is higher than the resistance of R2 and switch MN1 combined, then when MN0 is switched off and MN1 is switched on, the resistance will go down rather than up. This results in a non-monotonic DAC. Thus, to preserve monotonicity, all of the switches MN3 through MN0 are closed when the input is "00". The technique continues when switch MN1 is turned on. Instead of only switching on switch MN1, all of the switches located between MN1 and the end of the resistor string, i.e., switches MN3 and MN2, are also switched on.

The same technique is used when switching on the PMOS transistors. Initially only MP0 is switched on. As the input value increases, $V_{OUT}$ should also be increasing, so more of the PMOS transistors are also switched on, leaving on the ones already having been switched on. In this fashion, the resistance between $V_{DD}$ and $V_{OUT}$ is guaranteed to be decreasing for increasing input values, resulting in an increasing $V_{OUT}$, and a monotonic DAC. Thus, by using thermometric decoding, each time the DAC input code is incremented, the impedance between $V_{OUT}$ and $V_{SS}$ is made larger, while the impedance between $V_{OUT}$ and $V_{DD}$ is made smaller, no matter what is the matching of the resistors and the transistor switches. Thus, the output voltage $V_{OUT}$ is continuously increasing and the DAC will be monotonic.

It should be noted that, in the present invention, the minimal operating supply voltage of the DAC may be decreased to about the threshold voltage of the transistors. Furthermore, the size of the switching transistors may be made smaller since they are operated where their conductance is maximum, i.e. the NMOS channels are kept to the $V_{SS}$ voltage and the PMOS channels to the $V_{DD}$ voltage.

Although a specific example for the present invention has been given, it is possible to generalize the present invention as described above. Accordingly, a more general representation for the embodiments described above will now be given. Assume that a digital input has N-bits and that this input represents the number X. The low voltage DAC has a decoder, a resistor string, a set of NMOS switches labeled with the prefix MN, each of which is connected at one end to $V_{SS}$. There is a set of PMOS switches labeled with the prefix MP, each of which is connected at one end to $V_{DD}$. These NMOS and PMOS switches will be connected at the their other end to the resistor string as described below.

The resistor string has $2^{N+1}-1$ resistors that are numbered from R0 to $R(2^N-2)$. An output voltage $V_{OUT}$ corresponds to the node between $R(2^N-2)$ and $R(2^N-1)$. There are $2^N$ NMOS transistors numbered from MN0 to $MN(2^N-1)$, and there are $2^N$ PMOS transistors numbered from MP0 to $MP(2^N-1)$. Transistor MN0 is connected to $V_{OUT}$, and transistor $MN(2^N-1)$ is connected to the free terminal of R0. Transistor $MP(2^N-1)$ is connected to the node between $R(2^N-1)$, and $R(2^N)$. Transistor MP0 is connected to the free terminal of $R(2^N-1)$.

This generalized DAC operates as follows. For a given DAC input code that represents the value X, switching on only transistors MNX and MPX will ensure monotonicity, whatever the matching of the resistors, as long as the maximum difference of the impedance between any successive MOS devices is smaller than the value of the resistances.

However, if such an assumption cannot be made, then thermometric decoding is preferably used to ensure the monotonicity of the DAC. In this generalized example, for an input code with the value X, all PMOS transistors MPI should be switched on where I is less than or equal to the value of X. And, all NMOS transistors MNI should be switched on where I is greater than or equal to the value of X. All other transistors should be switched off. Such a thermometric decoding will ensure the monotonicity of the DAC, no matter what the matching is of all of the analog components (the resistors and the NMOS and PMOS transistors).

Figure 3:
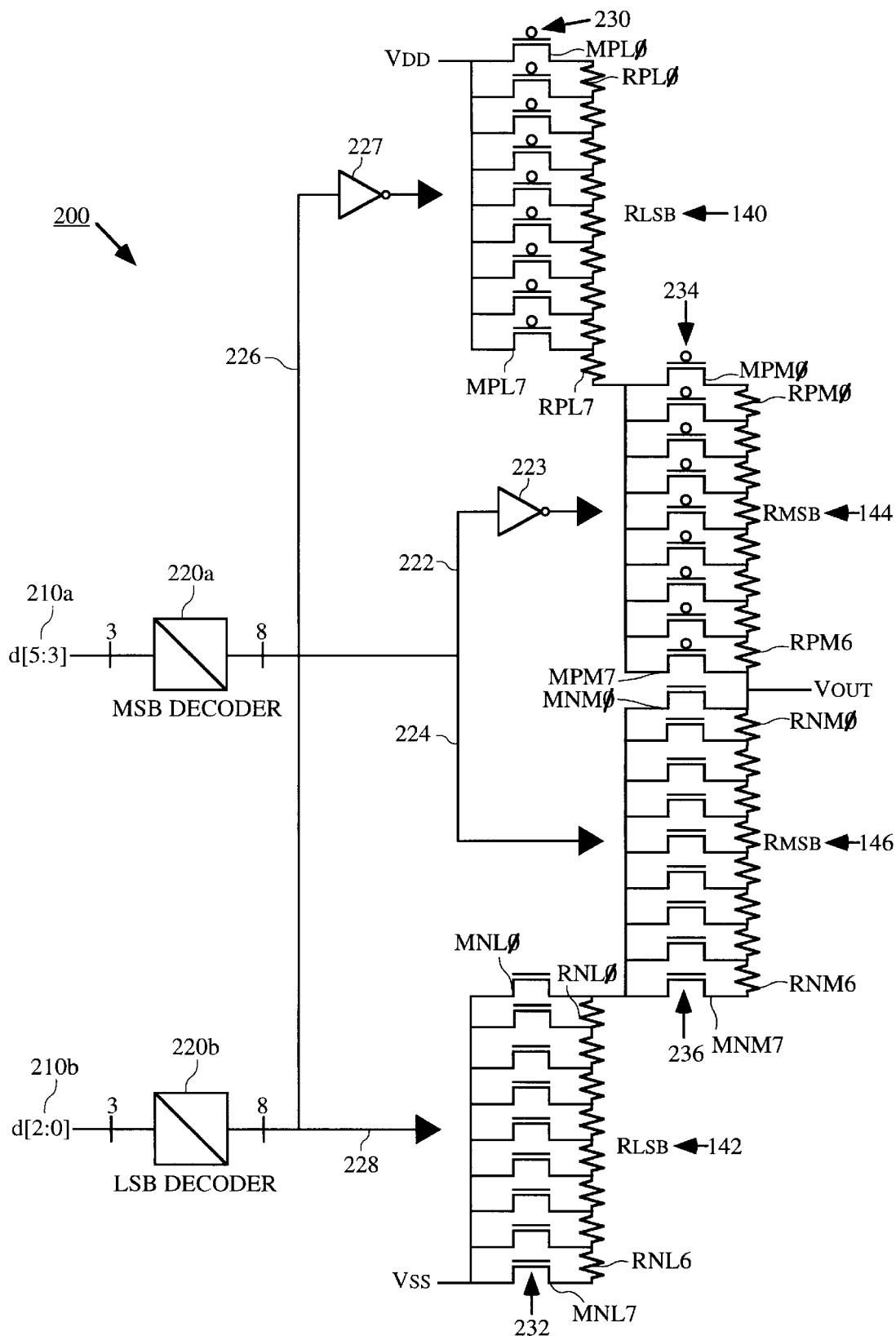
FIG. 3 is a low voltage digital-to-analog converter according to another embodiment of the present invention.

FIG. 3 illustrates an alternative embodiment of the present invention. Whenever an assumption can be made about the matching of the resistors, the required number of devices for a given resolution may be significantly reduced by using a two-step decoding scheme. For instance, a 6-bit resistor string DAC, according to the first embodiment of the present invention, normally requires 127 resistors and 128 MOS transistors. However, the two step decoding scheme as depicted in FIG. 3 only requires 29 resistors and 32 transistors.

The general structure of this alternative embodiment as shown in FIG. 3 will now be described. The abbreviations MSB and LSB will be used to represent respectively, "most significant bit" and "least significant bit", as before. A 6-bit digital input is decoded by an MSB decoder 220a and an LSB decoder 220b. More particularly, high bits d[5:3] are decoded by the MSB decoder 220a, and low bits d[2:0] are decoded by the LSB decoder 220b. The decoded input signal is used to control sets of PMOS transistors 230 and 234 and sets of NMOS transistors 232 and 236. Resistor strings 140, 144, 146, and 142 are used to divide the voltage. The voltage output is developed at $V_{OUT}$.

The structure of this alternative embodiment low voltage DAC will now be described in detail. The 6-bit digital input is split into two sets of input lines. The three most significant bit input lines 210a are input to the MSB decoder 220a. Likewise, the three least significant bit input lines 210b are input to the LSB decoder 220b. Each of the MSB and LSB decoders has eight output lines, one of which is selected or turned on according to the 3-bit input code.

The MSB decoder 220a has an 8-bit wide output 222 that passes through eight parallel inverters 223 in order to control the set of eight PMOS transistors 234. Unlike the embodiment described above where thermometric decoding was used, this alternative embodiment will select only one transistor from each set of transistors for a given input because of the assumption made regarding the matching of the resistors. The MSB decoder also has an 8-bit wide output 224 (which are the same bits as output 222), that controls the NMOS transistors 236. The LSB decoder has an 8-bit wide output 226 that passes through eight parallel inverters 227 in order to control the set of PMOS transistors 230. The LSB decoder also has an 8-bit wide output 228 (which are the same bits as output 226), that controls the set of NMOS transistors 232. The banks of eight inverters 227 and 223 are required because a low signal is needed to turn on the PMOS transistors.

The PMOS transistors 230 will be referred to as MPL0 to MPL7, and are used to switch in the supply voltage $V_{DD}$ to a node in the resistor string 140. Likewise, the PMOS transistors 234 are referred to as MPM0 through MPM7, and are used to switch in the output from the resistor string 140 to a node in the resistor string 144. Similarly, the NMOS transistors 232 are referred to as MNL0 through MNL7, and are used to switch in the $V_{SS}$ voltage to a node in the resistor string 142. The NMOS transistors 236 are referred to as MNM0 through MNM7, and are used to switch in the output from the resistor string 142 to a node in the resistor string 146.

The resistors 140 are referred to as RPL0 through RPL7. The resistors 144 are referred to as RPM0 through RPM6. The resistors 146 are referred to as RNM0 through RNM6, and the resistors 142 are referred to as RNL0 through RNL6. Each transistor is connected to a node in a resistor string as shown in FIG. 3. The value of each of the MSB resistors in either the resistor string 144 or 146 has a value that is greater than seven of the LSB resistors in resistor string 140 or 142 in order to ensure monotonicity.

Thus, in this embodiment, the transistors used for the MSB decoding are no longer always connected directly to the $V_{DD}$ and $V_{SS}$ supply voltages. Rather, these transistors are connected to $V_{DD}/8$ for the NMOS transistors, and $7V_{DD}/8$ for the PMOS transistors.

In order to keep the transistors conductive (according to the simplified first order linear approximation model for a MOS device described above), the following should be satisfied. For the NMOS device, the channel voltage is less than $V_{DD}-V_{TN}$. Thus, $V_{DD}/8$ is less than $V_{DD}-V_{TN}$ which implies that $V_{DD}>(V_{TN}*8)/7$. Likewise, for the PMOS device, the channel voltage is greater than $V_{TP}$. Thus, $(V_{DD}*7)/8$ is greater than $V_{TP}$ n which implies that $V_{DD}>(V_{TP}*8)/7$. Conductivity is still achieved for the transistors, as long as the supply voltage $V_{DD}$ is kept higher than 8/7 of the highest threshold voltage between $V_{TN}$ and $V_{TP}$. This is only a slight increase of the minimal operating voltage as described in the first embodiment.

Neglecting the contribution of the transistor switches mismatch, monotonicity may still be achieved provided that each of the MSB resistors in the string 144 or 146 is larger than seven of the LSB resistors in the resistor string 140 or 142. The mismatch of the transistors may be made as small as desired by increasing the device sizes. The requirement that each MSB resistor be bigger than seven LSB resistors requires only a 12.5% matching of the resistors. As a general rule, $\log_2$(resistor matching)-bit resolution may be implemented by means of the LSB decoder. Additionally, to achieve monotonicity, the transistors switches should be sized such that their maximum impedance difference is smaller than the resistance value of one LSB resistor. For example, for 5% matching between two identical switches, when the resistance value for one LSB resistor is 100 ohms, the nominal impedance of each switch should be smaller than 2 k ohm.

The operation of the low voltage DAC of FIG. 3 is explained as follows. When the digital input has a value of zero, the decoders will operate to close only switches MNL0, MNM0, MPM0, and MPL0. In this fashion, the supply voltage $V_{DD}$ drops through all of its associated resistors 140 and 144 before reaching $V_{OUT}$, while $V_{OUT}$ is switched in directly to voltage $V_{SS}$. Considering for a moment only the switches 232 and 236 corresponding to $V_{SS}$, the method by which resistors are switched will be described. For the next seven increasing values for the digital input, switch MNM0 will remain closed so that there will be no voltage drop through any of the resistors in the resistor string 146, while switches MNL1 through MNL7 are switched on one by one. Thus, the resistance between $V_{SS}$ and $V_{OUT}$ is progressively increased by adding to the signal path a resistor in the resistor string 142. At this point, all seven of the resistors RNL0 through RNL6 of resistor string 142 have been switched into the path from $V_{SS}$ to $V_{OUT}$ because only switches MNL7 and MNM0 are closed. Thus, the resistance between $V_{SS}$ and $V_{OUT}$ will be equivalent to 7x(the value of one LSB resistor).

For the next increase in value of the digital input code, switches MNL7 and MNM0 are opened and switches MNL0 and MNM1 will be closed. Thus, the resistance between $V_{SS}$ and $V_{OUT}$ will change from 7x(the value of one LSB resistor) to the value of one MSB resistor. Monotonicty is still achieved because for this increase in the digital input, an increase in resistance between $V_{SS}$ and $V_{OUT}$ has also been realized. This is because when the seven resistors RNL0 through RNL6 are switched out, the larger resistor RNM0 is switched into the path between $V_{SS}$ and $V_{OUT}$ due to the closure of switch MNM0, and because RNM0 is an MSB resistor in string 146, it has a value that is greater than seven of any of the LSB resistors in resistor string 142. Thus, the resistance between $V_{SS}$ and $V_{OUT}$ has increased for an increase in the digital input and monotonicity for the device will be preserved. In a similar fashion, the decoders will operate to successively decrease the total resistance between the supply voltage $V_{DD}$ and $V_{OUT}$ for each increase in the digital input code.

FIG. 3a shows a table 300 that illustrates the relationship between a six bit wide input code shown at column 302, the output from the MSB and LSB decoders, 304 and 306 respectively, and the corresponding switches to be closed 308. Shown in column 301 is the decimal representation of this input code. Column 304 shows the corresponding MSB decoder output that varies as the three most significant bits of the input code vary. Note that only one bit in this MSB decoder output will be set for a given input code. Likewise, at 306, the output for the LSB decoder is shown. For example, for an input code of zero, the LSB decoder output is a series of seven zeros followed by a one. This output is used directly to operate the NMOS switches MNL0 through MNL7. Each NMOS transistor switch is operated by its corresponding bit in the LSB decoder output. Thus, the bit at bit position zero of the LSB decoder output for an input code of "000 000", (which is a "1" in the case), is used to control switch MNL0. Similarly, the bit at bit position seven in the LSB decoder output (which is a "0"), is used to operate switch MNL7. This convention is also followed by the MSB decoder output used to control switches 234, 236.

Although a specific example has been shown for the alternative embodiment of FIG. 3, such a two-step decoding process may be generalized to be used with a digital input having any number of bits. For the general case, consider an N-bit DAC using a two-step decoding scheme. The MSB decoder will decode the M most significant bits, while the LSB decoder will decode the L least significant bits. The total of M+L will equal the value of N.

The LSB decoder section includes an LSB decoder, a set of NMOS and a set of PMOS transistors, and a set of equivalent LSB resistors. The LSB decoder decodes an L-bit digital input to a $2^L$ bit-wide output. This L-bit LSB binary decoder (as well as the MSB decoder), selects among only one of its output lines for a given input code. There are $2^L$ NMOS transistors that are referred to as MNL0 to MNL($2^L-1$). There are also $2^L$ PMOS transistors referred to as MPL0 to MPL($2^L-1$). There are $2^{(L+1)}-1$ equivalent resistors referred to as RNL0 to RNL($2^L-2$), and as RPL0 to RPL($2^L-1$).

The MSB decoding section contains the MSB decoder, a set of NMOS and a set of PMOS transistors, and a set of equivalent MSB resistors. The MSB decoder decodes an M-bit digital input to a $2^M$ bit-wide output. This M-bit MSB binary decoder selects among only one of its output lines for a given input code. There are $2^M$ NMOS transistors that are referred to as MNM0 to MNM($2^M-1$). There are also $2^M$ PMOS transistors referred to as MPM0 to MPM($2^M-1$). There are $2^{(M+1)}-2$ equivalent resistors referred to as RNM0 to RNM($2^M-2$), and as RPM0 to RPM($2^M-2$). Each of the MSB resistors should be designed to be greater than or equal to $2^L$ times the value of an LSB resistor. Monotonicity is ensured as long as the process mismatch is such that each MSB resistor has a value greater than $2^L-1$ times the value of an LSB resistor. Such a general two-step decoding low voltage DAC may be constructed in a similar fashion to the specific example of such a DAC as illustrated in FIG. 3. This general two-step decoding low voltage DAC may be operated in a similar fashion as described above with reference to FIGS. 3 and 3a.

Although the foregoing invention has been described in some detail for purposes of clarity of understanding, it will be apparent that certain changes and modifications may be practiced within the scope of the appended claims. For instance, the supply voltages $V_{SS}$ and $V_{DD}$ need not be ground and a positive voltage, respectively. There simply needs to be a relative difference in the voltage of the two supply voltages. Also, in the one-step decoding process, a single one of each of the PMOS and NMOS switches may be activated, or thermometric decoding may be used. And in the two-step decoding scheme, it is contemplated that further decoders and steps may be added along the lines illustrated. Therefore, the described embodiments should be taken as illustrative and not restrictive, and the invention should not be limited to the details given herein but should be defined by the following claims and their full scope of equivalents.

I claim:

1. A digital-to-analog converter comprising:
   a plurality of resistors coupled in series such that a node is defined between each of a plurality of resistor pairs of said series, and a node is also defined at each end of said series of resistors;
   an output permanently wired to a fixed node between a resistor pair of said plurality of resistor pairs; and
   a plurality of switches coupling a voltage source to a plurality of said nodes, where each of said switches has states including an on state and an off state, such that an output voltage developed at said output is dependent upon said states of said switches.

2. A digital-to-analog converter as recited in claim 1 wherein said voltage source includes a first voltage terminal and a second voltage terminal, and wherein said plurality of switches include a plurality of first switches coupling said first voltage terminal to a plurality of nodes on a first side of said fixed node, and a plurality of second switches coupling said second voltage terminal to a plurality of nodes on a second side of said fixed node.

3. A digital-to-analog converter as recited in claim 2 wherein said first voltage terminal is a ground voltage $V_{SS}$, and wherein said second voltage terminal is a positive power supply voltage $V_{DD}$.

4. A digital-to-analog converter as recited in claim 3 wherein said first switches comprise NMOS transistors, and wherein said second switches comprise PMOS transistors.

5. A digital-to-analog converter as recited in claim 1 further comprising a decoder responsive to a digital input and operative to control said states of said switches.

6. An N-bit digital-to-analog converter (DAC) comprising:
   $2^{(N+1)}-1$ resistors coupled in series ranging from a resistor R(0) to a resistor R($2^{N+1}-2$), thereby defining $2^{(N+1)}-2$ nodes between adjacent resistors ranging from N(0) to N($2^{N+1}-3$), where resistor R(0) and resistor R($2^{N+1}-2$) each have a free end node;
   a fixed output node at one of said nodes;
   $2^N$ NMOS transistors ranging from MN($2^N-1$) to MN(0);
   a first voltage node coupled to said free end node of resistor R(0) by transistor MN($2^N-1$), and to nodes N(0) to N($2^N-2$) by transistors MN($2^N-2$) to MN(0), respectively;
   $2^N$ PMOS transistors ranging from MP($2^N-1$) to MP(0);
   a second voltage node that is positive relative to said first voltage node, said second voltage node being coupled to nodes N($2^N-1$) to N($2^{N+1}-3$) by transistors MP($2^N-1$) to MP(1) respectively, and to said free end node of resistor R($2^{N+1}-2$) by transistor MP(0);

a decoder coupled to and capable of switching on and switching off said NMOS transistors and said PMOS transistors, said decoder having a digital input N bits wide, where for a digital input representing the value X, transistors MN(X) and MP(X) are switched on.

7. An N-bit DAC as recited in claim 6 wherein, for a digital input representing the value X, said NMOS and said PMOS transistors other than transistors MN(X) and MP(X) are switched off.

8. An N-bit DAC as recited in claim 6 wherein, for a digital input representing the value X, all transistors MP(I) with I less than X are also turned on, and all transistors MN(I) with I greater than X are also turned on.

9. A method for digital-to-analog conversion using a series connection of resistors, said series having a first end and a second end, a node being defined between each of a plurality of resistor pairs of said series, a node also being defined at said first and said second end of said series of resistors, a fixed node being located between said first end and said second end inclusive, a first plurality of switches arranged to be able to apply a first voltage to a first set of nodes adjacent to said first end, a second plurality of switches arranged to be able to apply a second voltage to a second set of nodes adjacent to said second end, said method comprising the steps of:
  closing at least one switch of said first plurality of switches to apply said first voltage to a first node of said series connection of resistors;
  closing at least one switch of second plurality of switches to apply said second voltage to a second node of said series connection of resistors; and
  deriving an output voltage at an output from said fixed node between said first node and said second node, said output being essentially always equip potential with said fixed node.

10. A method as recited in claim 9 further comprising the steps of:
  closing a first group of switches of said first plurality of switches such that said first voltage is applied to all nodes located between said first node and said first end inclusive; and
  closing a second group of switches of said second plurality of switches such that said second voltage is applied to all nodes located between said second node and said second end inclusive.

11. A method as recited in claim 10 wherein said first plurality of switches include NMOS transistors and said second plurality of switches include PMOS transistors.

12. A method for providing digital-to-analog conversion comprising:
  providing $2^{(N+1)}-1$ resistors coupled in series ranging from a resistor R(0) to a resistor $R(2^{N+1}-2)$, thereby defining $2^{(N+1)}-2$ nodes between adjacent resistors ranging from N(0) to $N(2^{N+1}-3)$, where resistor R(0) and resistor $R(2^{N+1}-2)$ each have a free end node;
  providing a fixed output node at one of said nodes;
  providing $2^N$ NMOS transistors ranging from $MN(2^N-1)$ to MN(0);
  coupling a first voltage node to said free end node of resistor R(0) by transistor $MN(2^N-1)$, and to nodes N(0) to $N(2^N-2)$ by transistors $MN(2^N-2)$ to MN(0), respectively;
  providing $2^N$ PMOS transistors ranging from $MP(2^N-1)$ to MP(0);
  coupling a second voltage node that is positive relative to said first voltage node to nodes $N(2^N-1)$ to $N(2^{N+1}-3)$ by transistors $MP(2^N-1)$ to MP(1) respectively, and to said free end node of resistor $R(2^{N+1}-2)$ by transistor MP(0);
  decoding a digital input representing the value X, said digital input being N bits wide; and
  switching on transistors MN(X) and MP(X).

13. A method as recited in claim 12 wherein, for a digital input representing the value X, said NMOS and said PMOS transistors other than transistors MN(X) and MP(X) are switched off.

14. A method as recited in claim 12 wherein, for a digital input representing the value X, all transistors MP(I) with I less than X are also turned on, and all transistors MN(I) with I greater than X are also turned on.

15. A method for making a digital-to-analog converter comprising:
  forming a plurality of resistors connected in series on a semiconductor substrate, thereby defining a plurality of nodes between said plurality of resistors;
  permanently electrically coupling an output to a fixed node between a pair of said resistors;
  forming a plurality of switches on said semiconductor substrate that couple a voltage source to said plurality of nodes; and
  forming a decoder on said semiconductor substrate that is responsive to a digital input and which controls said plurality of switches such that an analog voltage corresponding to said digital input is developed at said output.

16. A method for making a digital-to-analog converter as recited in claim 15 wherein said voltage source includes a first voltage terminal and a second voltage terminal, and wherein said plurality of switches include a plurality of first switches coupling said first voltage terminal to a plurality of nodes on a first side of said fixed node, and a plurality of second switches coupling said second voltage terminal to a plurality of nodes on a second side of said fixed node.

17. A method for making a digital-to-analog converter as recited in claim 16 wherein said first voltage terminal is a ground voltage $V_{SS}$, and wherein said second voltage terminal is a positive power supply voltage $V_{DD}$.

18. A method for making a digital-to-analog converter as recited in claim 17 wherein said first switches comprise NMOS transistors, and wherein said second switches comprise PMOS transistors.

19. A digital-to-analog converter comprising:
  an N bit input representing a value X, said N bit input having M most significant bits and L least significant bits, where N is equal to M plus L;
  a first LSB bank of LSB resistors coupled in series with a first MSB bank of MSB resistors, said first LSB bank and said first MSB bank being coupled between a first voltage node and a fixed output node;
  a second LSB bank of LSB resistors coupled in series with a second MSB bank of MSB resistors, said second LSB bank and said second MSB bank being coupled between a second voltage node and said fixed output node;
  an MSB decoder coupled to said N bit input to decode the most significant M bits of said input, said MSB decoder controlling said first MSB bank and said second MSB bank;
  an LSB decoder coupled to said N bit input to decode the least significant L bits of said input, said LSB decoder controlling said first LSB bank and said second LSB bank, whereby said LSB decoder operates to selectively apply said first voltage to said first LSB bank, and said second voltage to said second LSB bank, and said MSB decoder operates to selectively apply a first LSB output from said first LSB bank to said first MSB bank and operates to selectively apply a second LSB output from said second LSB bank to said second MSB bank.

20. A digital-to-analog converter as recited in claim 19 wherein said first voltage is applied to said first LSB bank of resistors by a plurality of LSB PMOS transistor switches, said first LSB output is applied to said first MSB bank of resistors by a plurality of MSB PMOS transistor switches, said second voltage is applied to said second LSB bank of resistors by a plurality of LSB NMOS transistor switches, said second LSB output is applied to said second MSB bank of resistors by a plurality of MSB NMOS transistor switches.

21. A digital-to-analog converter as recited in claim 20 wherein when an N bit input is received by said MSB and LSB decoders, said decoders operate to switch on only one transistor switch from each of said LSB PMOS transistor switches, said MSB PMOS transistor switches, said LSB NMOS transistor switches, and said MSB NMOS transistor switches.

22. A digital-to-analog converter as recited in claim 21 wherein each MSB resistor has a value that is equal to or greater than the value of $2^L - 1$ LSB resistors.

* * * * *